(12) United States Patent
Forssell

(10) Patent No.: US 11,874,331 B2
(45) Date of Patent: Jan. 16, 2024

(54) INTELLIGENT BATTERY DEVICE AND BATTERY SYSTEM

(71) Applicant: Volvo Car Corporation, Gothenburg (SE)

(72) Inventor: Jonas Forssell, Gothenburg (SE)

(73) Assignee: VOLVO CAR CORPORATION, Gothenburg (SE)

( * ) Notice: Subject to any disclaimer, the term of this patent is extended or adjusted under 35 U.S.C. 154(b) by 2 days.

(21) Appl. No.: 17/565,599

(22) Filed: Dec. 30, 2021

(65) Prior Publication Data

US 2023/0228821 A1    Jul. 20, 2023

(51) Int. Cl.
*G01R 31/385*    (2019.01)
*G01R 31/36*     (2020.01)
(Continued)

(52) U.S. Cl.
CPC ......... *G01R 31/385* (2019.01); *G01R 31/367* (2019.01); *G01R 31/3644* (2013.01); *G01R 31/396* (2019.01); *H01M 10/4285* (2013.01)

(58) Field of Classification Search
CPC .. G01R 31/385; G01R 31/396; G01R 31/367; G01R 31/3644; H01M 10/4285;
(Continued)

(56) References Cited

U.S. PATENT DOCUMENTS

| 8,134,338 B2 | 3/2012 | Choi |
| 9,362,757 B2 | 6/2016 | Deal et al. |

(Continued)

FOREIGN PATENT DOCUMENTS

| EP | 2681782 B1 | 1/2014 |
| EP | 2705564 B1 | 3/2014 |

(Continued)

OTHER PUBLICATIONS

Xia et al., "State-of-charge Balancing of Lithium-ion Batteries with State of-health Awareness Capability" DOI 10.1109/TIA.2020.3029755 (2020) 12 pages.

(Continued)

*Primary Examiner* — Christopher P McAndrew
*Assistant Examiner* — Trung Q Nguyen
(74) *Attorney, Agent, or Firm* — Amin, Turocy & Watson, LLP

(57) ABSTRACT

One or more systems, devices, and/or system-implemented methods are provided that can facilitate provision of varying AC output voltage or DC output voltage, including selectively separately providing a positive voltage output, a negative voltage output and no voltage output. A device can comprise a battery cell, and a controller connected to the battery cell and that varies output from the battery cell, wherein the controller is configured to cause the battery cell to selectively separately provide negative output voltage, positive output voltage and no output voltage. A method can comprise varying output polarity from a multi-cell battery cluster and selectively providing one or both of alternating current (AC) voltage output or direct current (DC) voltage output from the multi-cell battery cluster due to the varying of the output polarity.

20 Claims, 12 Drawing Sheets

(51) Int. Cl.
*H01M 10/42* (2006.01)
*G01R 31/396* (2019.01)
*G01R 31/367* (2019.01)

(58) Field of Classification Search
CPC .. Y02E 60/10; H02J 7/36; B60L 58/21; Y02T 10/70
USPC ........ 324/425–434, 124–129, 134, 415–419, 324/500, 600, 76.11
See application file for complete search history.

(56) References Cited

U.S. PATENT DOCUMENTS

| | | | |
|---|---|---|---|
| 9,891,286 | B2 | 2/2018 | Fetzer et al. |
| 10,056,654 | B2 | 8/2018 | Butzmann et al. |
| 10,205,327 | B2 | 2/2019 | Okui |
| 2011/0198936 | A1 | 8/2011 | Graovac |
| 2016/0211663 | A1 | 7/2016 | Rapp |
| 2016/0261123 | A1 | 9/2016 | Rapp |
| 2019/0229540 | A1* | 7/2019 | Lee ................ H02J 7/0024 |
| 2020/0274368 | A1 | 8/2020 | Crouse, Jr. |
| 2021/0126471 | A1 | 4/2021 | Srivastava et al. |

FOREIGN PATENT DOCUMENTS

| | | |
|---|---|---|
| GB | 2584424 A | 12/2020 |
| WO | 2016174117 A1 | 11/2016 |
| WO | 2020219440 A1 | 10/2020 |

OTHER PUBLICATIONS

Chowdhury et al., "An Integrated State of Health (SOH) Balancing Method for Lithium-Ion Battery Cells" 978-1-7281-0395-2/19/$31.00 © 2019 IEEE (2019) 5 pages.
Forssell et al., "Intelligent Battery Cell With Integrated Monitoring and Switches" U.S. Appl. No. 63/059,300, filed Jul. 31, 2020.
Ekström et al., "Intelligent Battery Cell" U.S. Appl. No. 63/246,483, filed Sep. 21, 2021.
International Search Report and Written Opinion for International Application No. PCT/EP2022/087034 dated Mar. 17, 2023.

* cited by examiner

INTELLIGENT BATTERY DEVICE AND BATTERY SYSTEM

BACKGROUND

In existing technologies, an electric driveline (e.g., an electric driveline used in an electric vehicle) can be based on a battery with a direct current (DC) voltage of a single voltage quantity. Systems, such as vehicle systems, can be designed around such battery to protect and to control the battery. Auxiliary units can be used to generate alternating current (AC) voltage to run motors and charge the battery. All these systems can be complex and expensive and can be a source of error.

Also in existing technologies, the battery can comprise one or more battery packs each comprising one or more cells. These battery packs are always on, that is, the battery packs always have a live voltage. The battery packs provide a constant and single voltage and therefore the auxiliary units described above are used to provide fluctuating voltage (e.g., AC voltage) and/or lower voltage (e.g., 12V, 14V, 48V, etc.). In addition, existing battery management systems (BMSs) for such batteries include a set of sensor cables and/or submodules that can add complexity and/or cost to a parent system employing the BMS and one or more of the batteries. The existing BMSs monitor only battery cell parameters and not global battery pack parameters, and are not integrated inside the respective battery packs.

SUMMARY

The following presents a summary to provide a basic understanding of one or more embodiments described herein. This summary is not intended to identify key or critical elements, or to delineate any scope of the particular embodiments and/or any scope of the claims. The sole purpose of the summary is to present concepts in a simplified form as a prelude to the more detailed description that is presented later. In one or more embodiments described herein, devices, systems, methods and/or apparatuses are described that can facilitate provision of varying AC output voltage or DC output voltage, including selectively separately providing a positive voltage output, a negative voltage output and no voltage output.

According to one embodiment, a device can comprise a battery cell, and a controller connected to the battery cell and that varies output from the battery cell, wherein the controller is configured to cause the battery cell to selectively separately provide negative output voltage, positive output voltage and no output voltage.

In one or more embodiments, the controller can comprise the controller can comprise one or more switches that are actuatable by the controller to provide the positive output voltage, negative output voltage, or no output voltage by bypassing the battery cell.

In one or more embodiments, the controller can comprise a transformer and further can be configured to provide an auxiliary voltage from the device via the transformer, wherein the auxiliary voltage has an absolute value that is less than an absolute value of the negative voltage or positive voltage.

In one or more embodiments, the controller can comprise a processor that monitors temperature or battery charge of the battery cell.

In one or more embodiments, the controller can comprise a transformer that enables charging of the battery cell by an alternating current source.

According to another embodiment, a method can comprise varying output polarity from a multi-cell battery cluster and selectively providing one or both of alternating current (AC) voltage output or direct current (DC) voltage output from the multi-cell battery cluster due to the varying of the output polarity.

According to yet another embodiment, a system can comprise a vehicle comprising a pair of battery devices each individually comprising a battery cell and a controller connected to the battery cell and that varies voltage output polarity from the battery cell to selectively provide one or both of an alternating current (AC) voltage output or a direct current (DC) voltage output from the pair of battery devices.

DESCRIPTION OF THE DRAWINGS

One or more exemplary embodiments are described below in the Detailed Description section with reference to the following drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It will be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling. Likewise, it will be understood that when an element is referred to as being "connected" to another element, it can describe one or more different types of connecting including, but not limited to, electrical connecting, electromagnetic connecting, operative connecting, optical connecting, physical connecting, thermal connecting, and/or another type of connecting.

While one or more devices and/or systems are described below with reference to a wheeled vehicle, such as an automobile, the one or more embodiments described herein are not limited to this use. A battery device and/or battery system described herein can be implemented in any suitable electronic system such as, for instance, an electric driveline of an electric vehicle (EV). Indeed, the one or more devices and/or systems described herein can be utilized with any of a military vehicle, marine vehicle such as a boat or marine drone, winged vehicle such as a plane, and/or rotor-ed vehicle such as a helicopter or drone. Likewise, usage can extend to a robot and/or any suitable mobile and/or stationary device having use of a battery device or battery system.

Turning now to the figures, one or more embodiments described herein can include one or more devices, systems, apparatuses and/or system-implemented methods that can facilitate provision of varying AC output voltage or DC output voltage, including selectively separately providing a positive voltage output, a negative voltage output and no voltage output.

Figure 1:
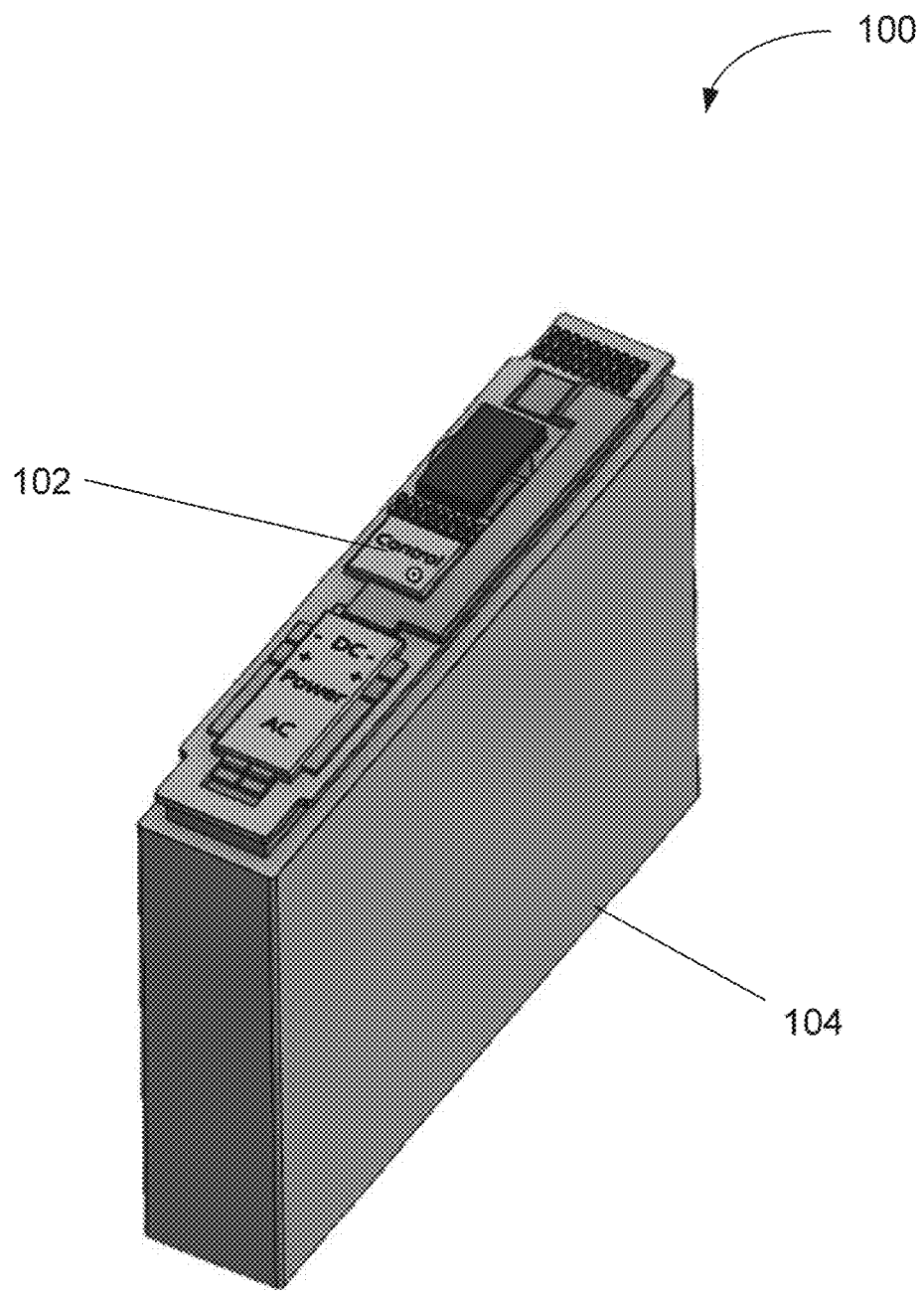
FIG. 1 illustrates an orthogonal view of a battery device comprising a single battery cell, in accordance with one or more embodiments described herein.

Looking first to FIG. 1, illustrated is a battery device 100 comprising a controller 102, in the form of a controller board, and a battery cell 104. The controller 102 is connected to the battery cell 104 for monitoring and controlling the battery cell 104. The battery cell 104 is a power source in itself and can comprise any suitable materials, including any suitable material for retaining charge. The controller 102 (e.g., controller board) can be welded directly and/or indirectly onto cell poles of the battery cell 104, and the controller 102 can be powered by the battery cell 104.

Figure 2:
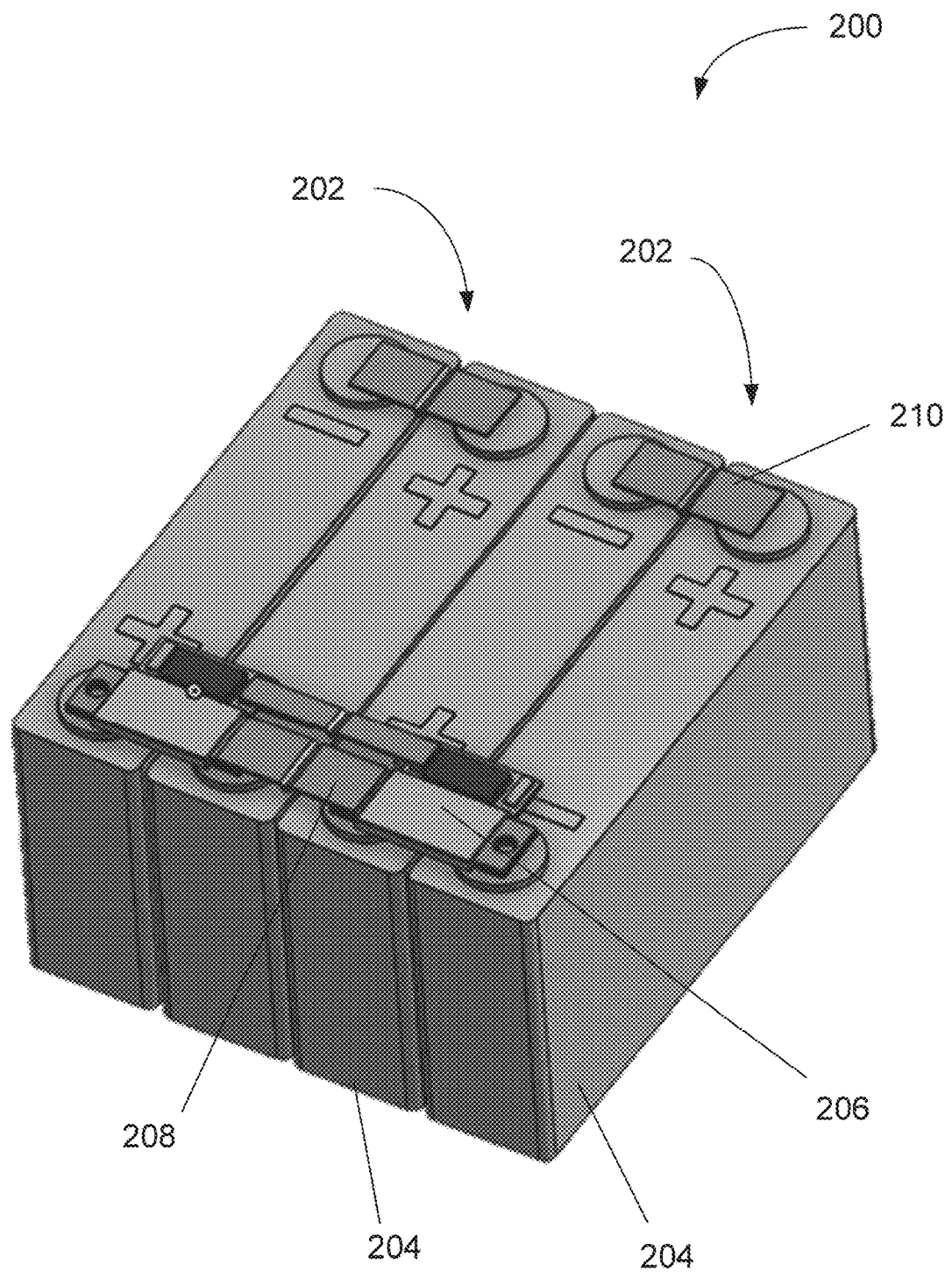
FIG. 2 illustrates an orthogonal view of a battery system comprising a pair of battery devices each comprising a pair of battery cells, in accordance with one or more embodiments described herein.

Turning now to FIG. 2, illustrated is a battery system 200 can be described as an intelligent battery system or smart battery system. The battery system 200 comprises a pair of battery devices 202 arranged side by side, although this arrangement can be otherwise. Each battery system 200 comprises a pair of battery cells 204 controlled by a common controller 206, such as a controller board. The controller 206 can be comprised by a first connector 208 arranged to connect opposite poles of a pair of battery cells 204. Another pole connector 210 can be arranged to connect the pair of opposite poles of the battery cells 204 of each battery device 202.

The first and second battery devices 202 of the battery system 200 can communicate with one another via any suitable method. In one embodiment, wireless communication can be provided by the separate controllers 206.

In one or more embodiments, the controller 206 can be coupled (e.g., communicatively, electrically, operatively, optically, etc.) to one or more external systems, sources, and/or devices (e.g., classical and/or quantum computing devices, communication devices, etc.) via a network. The network can comprise one or more wired and/or wireless networks, including, but not limited to, a cellular network, a wide area network (WAN) (e.g., the Internet), and/or a local area network (LAN). For example, the battery system 200 can communicate, such as via the controllers 206, with one or more external systems, sources, and/or devices, for instance, computing devices using the network, which can comprise virtually any desired wired or wireless technology, including but not limited to: powerline ethernet, wireless fidelity (Wi-Fi), BLUETOOTH®, fiber optic communications, global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example and as described above, controller 206 can thus include hardware (e.g., a central processing unit (CPU), a transceiver, a decoder, an antenna, quantum hardware, a quantum processor, etc.), software (e.g., a set of threads, a set of processes, software in execution, quantum pulse schedule, quantum circuit, quantum gates, etc.) or a combination of hardware and software that facilitates communicating information between battery system 200 and external systems, sources, and/or devices (e.g., computing devices, communication devices, etc.).

Referring now to the battery system 200 generally, and still referring to FIG. 2, the battery system 200 can vary output polarity from one or more cells, such as a multi-cell battery cluster, to selectively provide one or both of alternating current (AC) voltage output or direct current (DC) voltage output from the battery system due to the varying of the output polarity. To provide the AC voltage output and/or DC voltage output, the local controllers, e.g., controllers 206, can selectively separately provide negative output voltage, positive output voltage and no output voltage. That is, relative to one battery device 202, a respective controller 206 can provide on of negative output voltage, positive output voltage or no output voltage at a time. Regarding provision of no voltage, a controller 206 can be configured, such as via one or more elements thereof to be described below in detail, to bypass the battery cells 204 controlled by the controller 206. As such, relative to the multi-cell battery cluster system of the battery system 200, one multi-cell battery cluster can by bypassed while another multi-cell battery cluster can provide an output voltage. In one or more embodiments, two or more, or even all, multi-cell battery clusters (e.g., battery devices 202) can be bypassed to provide less or even no voltage from a respective battery system 200.

In one or more embodiments, the battery system 200 can comprise a global controller to control and/or manage the controllers 206. In one or more embodiments, a battery system, such as including a plurality of battery cells provided in three strings of battery cells, can provide a three phase current source via a parallel coupling of the battery cell strings. Accordingly, an output, represented as a three phase sinusoidal output, can be provided, such as to generate a rotating magnetic field for operation of a motor, such as a motor driving one or more axles, gears and/or wheels of a vehicle. Indeed, in one or more embodiments, one or more motors can be controlled directly by such expanded battery system. That is, such direct control can be implemented absent employment of additional inverters, transformers, chargers and/or other components typically implements in existing technologies comprising constant voltage DC batteries.

Furthermore, generally, the battery system 200 can be operated to charge one or more battery cells 204, such as one or more battery devices 202 of the battery system 200 at a time, and such as without additional transformers, inverters or chargers. That is, the controllers 206 can provide the functions of such additional transformers, inverters and chargers employed in existing systems.

In one or more embodiments, an AC output and a DC output can be provided contemporaneously by the battery system 200. In one or more embodiments, the battery system 200 can be controlled to convert voltage from one or more respective battery cells 204 to a lesser voltage, such as to power one or more auxiliary systems of a vehicle, such as panels, lights, AC chargers, and/or the like. This can be accomplished absent use of transformers, inverters and/or chargers separate from the battery system 200, and indeed without such elements separate from the battery controller 206 in one or more embodiments.

Figure 3:
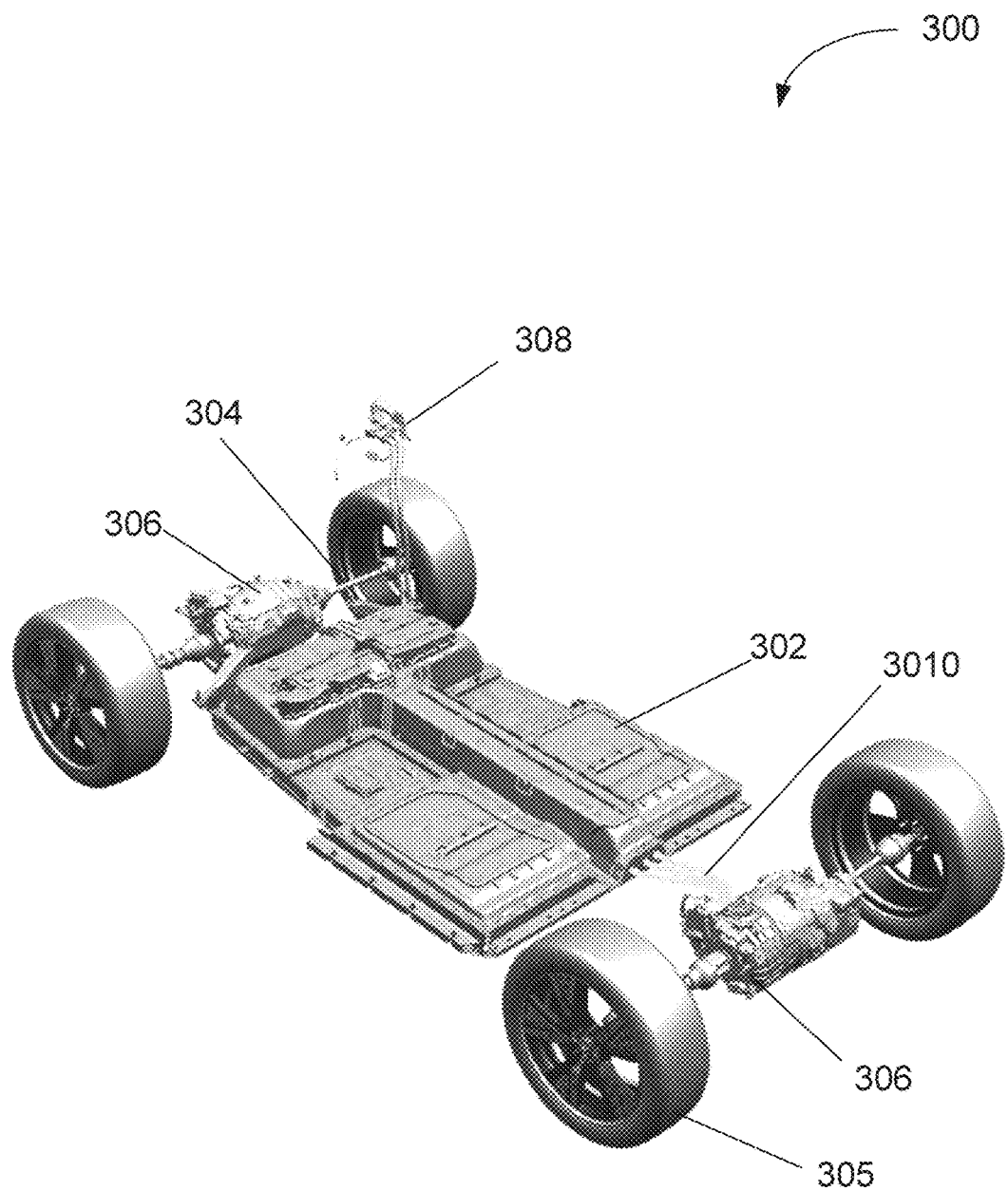
FIG. 3 illustrates a schematic orthogonal view of a vehicle comprising the battery system of FIG. 2, in accordance with one or more embodiments described herein.

Turning now to FIG. 3, a portion of a vehicle 300 is illustrated. The vehicle 300 comprises a body portion 302, a pair of axles 304 and wheels 305 connected to the axles 304 for driving movement of the body portion 302. Rotation of the axles 304 is driven by a pair of motors 306, such as traction motors, that are directly controlled by a global controller 308 connected to the motors 306 by one or more connectors 310, such as wires, cables and/or the like. While not shown, the global controller 308 can control a battery system, such as the battery system 200 or battery system 900 of FIG. 9, such as controlling local controllers of such battery system, such as the local controllers 206 or 906. As such, the motors 306, via the connectors 310 and/or other connectors, also such as wires, cables and/or the like, can provide power, such as in a form of AC voltage for driving the motors 306. Such battery system can, in one or more embodiments, provide varying levels of AC output voltage for driving different motors. Likewise, such battery system can, in one or more embodiments, contemporaneously provide different AC voltage to different motors, which different AC voltages can have different phases.

As shown at FIG. 3, additional inverters, transformers, AC chargers, controllers, converters and/or the like are not implemented to drive the motors 306 and/or to power one or more auxiliary systems (not shown). That is, a battery system as described herein can be operated to directly control the motors. Such battery system can provide power directly to the motors and to one or more auxiliary systems of a vehicle at least partially contemporaneously.

Figure 4:
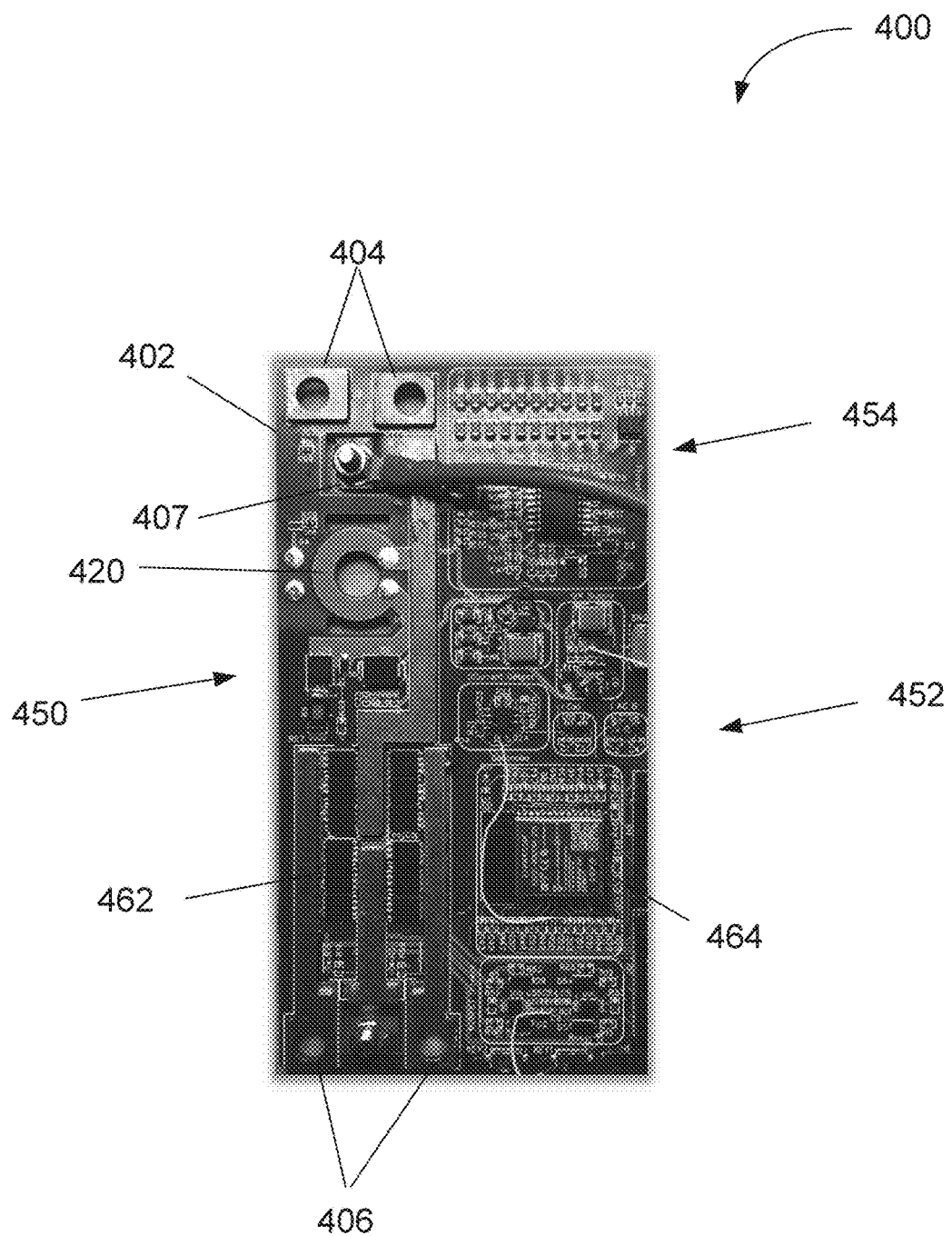
FIG. 4 illustrates controller in the form of a controller board, in accordance with one or more embodiments described herein.

Looking next to FIG. 4 a controller 400 is illustrated that can be employed as the controller 102, 206 and/or 906, for example. The controller 400 can comprise any type of component, machine, element, portion, apparatus, and/or instrument that can comprise a processor and/or can be capable of effective and/or operative communication with a wired and/or wireless network. All such embodiments are envisioned. For example, the controller 400 can comprise a computing device, a general-purpose computer, a special-purpose computer, a quantum computing device (e.g., a quantum computer), an integrated circuit, a system on a chip (SOC), and/or another type of device.

As shown, the controller 400, in the form of a controller board, can comprise a substrate 402 comprised of any suitable substrate material. The controller 400 can comprise four outputs, such as a pair of DC output poles 404 and two AC output poles 406. Additionally, battery input poles 407 are provided.

Multiple battery devices (e.g., each having one or more battery cells) can be connected to one another by the AC output poles 406. Cells of a single battery device, employing the single controller 400 for control of each of the cells, can be connected to one another by the controller 400 and/or by a bridge connector that comprises the controller 400. As indicated relative to FIG. 1, the controller 400 can be powered by the battery cells connected to the controller 400.

The DC output poles 404 can be isolated from one another, such as for powering different auxiliary systems of a vehicle via a single controller 400. The DC output poles 404 can be connected to a transformer 420 for converting voltage received from the respective battery cells to a constant voltage, such as in a range of about 10 volts (V) to about 60 V, such as about 12 V, about 14 V or about 48V. In one or more embodiments, the auxiliary voltage provided to the DC output poles 404 can have an absolute value that is less than an absolute value of a negative voltage or positive voltage provided, and/or capable of being provided, at the AC output poles 406.

In one or more embodiments, the controller 400 can provide power simultaneously to one or more auxiliary devices via the DC output poles 404 and to one or more devices, such as traction motors, via the AC output poles 406. In one or more embodiments, DC output voltage can be provided to each of the isolated DC output poles 404 simultaneously.

Still referring to FIG. 4, the controller 400 can comprise multiple sections including, but not limited to, a switch section 450, a monitor and/or control section 452, an energy section, a communication section 454 and/or another section.

Switch section 450 can comprise multiple switches 462, such as comprising an H-bridge electronic circuit having multiple switches (e.g., 4 switches comprising 4 metal-oxide-semiconductor field-effect transistor switches). The switches 462 can be operated, such as by a processor, such as a processor chip 464 of the monitor and/or control section 452, to provide a negative output voltage, a positive output voltage or no output voltage at the AC output poles 406. Accordingly, such switches can facilitate different operating modes (e.g., off, positive, negative, bypass, etc.) of a battery device (e.g., comprising the controller 400 and one or more battery cells) in accordance with one or more embodiments described herein.

In one or more embodiments, the controller 400 can comprise a switch controller that can control (e.g., via a processor) operation of such one or more switches 462 to facilitate such different operating modes of the device described above.

By employing the switches 462, as controlled by a processor, such as processor chip 464 and/or switch controller, when the controller 400 is employed for one battery device of a plurality of battery devices of a battery system (also having additional controllers), an AC output or a DC output can be provided from the battery system. Indeed, output polarity from each multi-cell battery device (e.g., multi-cell battery cluster) can be selectively controlled to selectively provide AC voltage output or DC voltage output due to the varying of the output polarity.

Figure 6:
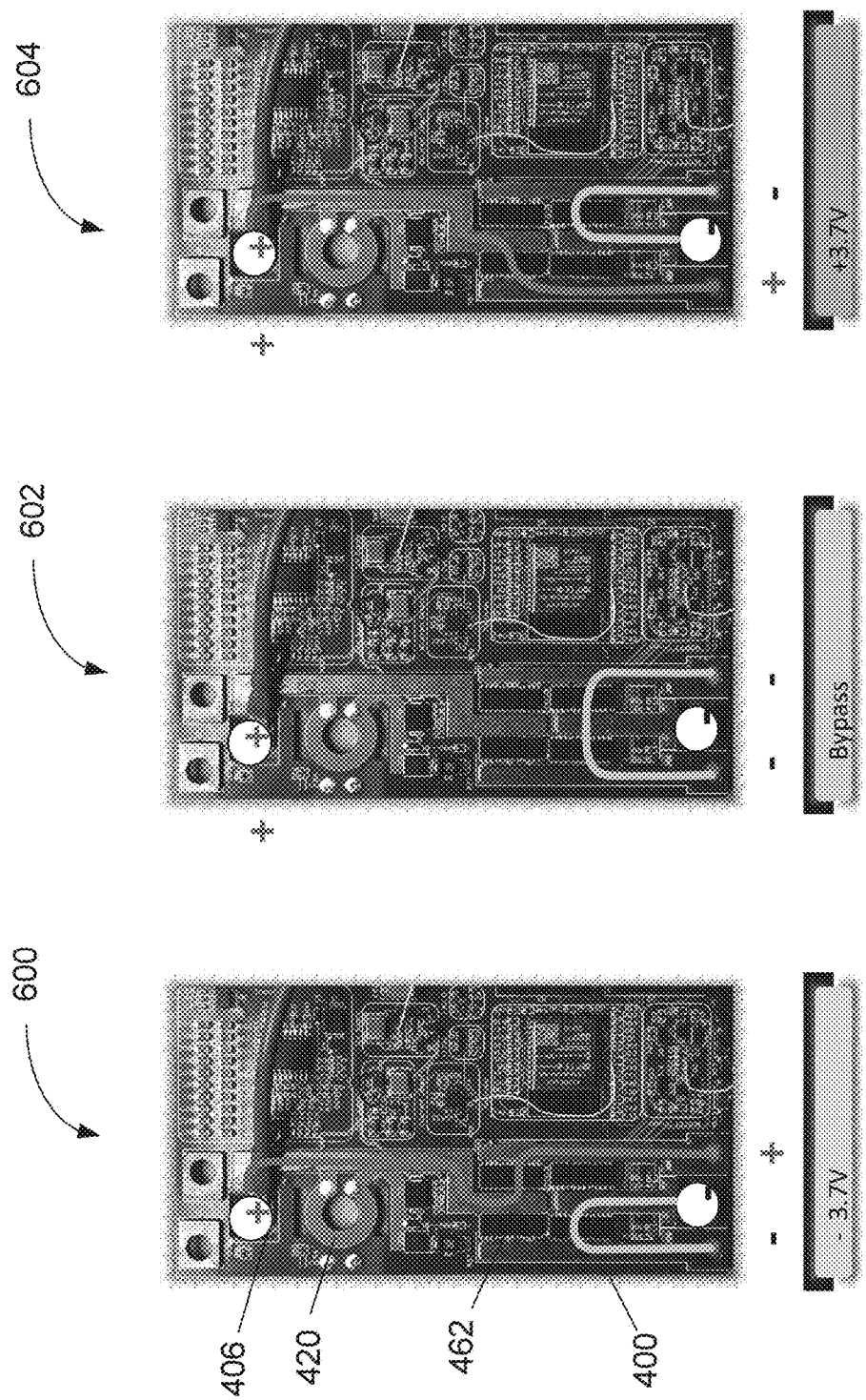
FIG. 6 illustrates a set of three controllers in the form of controller boards, in accordance with one or more embodiments described herein.

Turning briefly to FIG. 6, three variations of employment of the controller 400 are illustrated. At diagram 600, AC output poles 406 are connected via the switches 462, as shown by the +/+ line, to provide a negative output voltage. At diagram 602, AC output poles 406 are connected via the switches 462, as shown by the −/− line, to bypass the controller 400, and thus to provide no output voltage. At diagram 604, AC output poles 406 are connected via the switches 462, as shown by the +/+ line to provide a positive output voltage. Where all three controllers at 600, 602 and 604 are connected in a battery system, and thus each connected to respective one or more battery cells, a combined output voltage across the three controllers is shown as being 0 volts.

Turning again to FIG. 4, where the controller 400 is coupled to a charger, charging port and/or the like, such as an AC charger, the switches 462 can be operated to charge or to bypass charging of the battery cells connected to the controller 400. This can allow, for instance, other controllers 400 of other battery devices of a larger battery system to receive the charging voltage. This also can allow for charging of a larger battery system with different voltage charging outputs, such as about 400 V or about 800 V for example.

The transformer 420, and/or another transformer, can be connected between the battery cells and the DC output poles 404 to provide a constant voltage from a voltage provided by the one or more battery cells connected to the controller 400.

Figure 7:
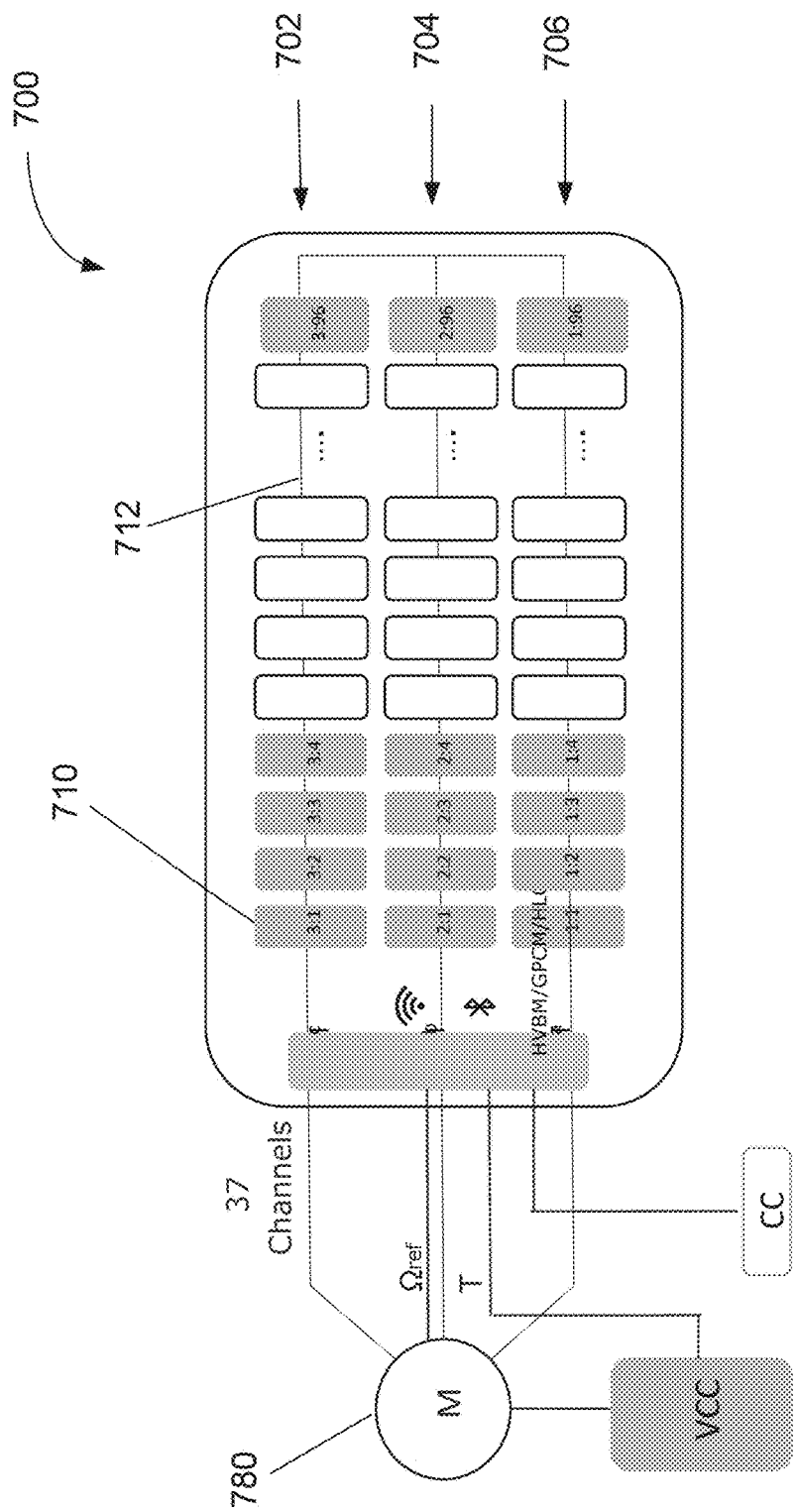
FIG. 7 illustrates a block diagram of a battery system, in accordance with one or more embodiments described herein.

The communication section 454 can comprise a receiver, transmitter, antenna and/or other component for facilitating wireless communication between one or more controllers of a larger battery system and/or for facilitating communication with a global controller, such as is illustrated at FIG. 7, to be described below in detail.

The monitor and/or control section 452 can comprise a processor (e.g., such as the processor chip 464), memory, and/or one or more sensors. To facilitate various monitoring and/or control functions of the controller 400 and/or of one or more battery cells connected to the controller 400, the controller 400, processor, memory, one or more sensors, and/or one or more switches can use (e.g., draw) electric energy (e.g., electric power, electric current, electric voltage) from the connected battery cells. For example, the processor and/or memory can be coupled to active cell material via wire traces (e.g., integrated metal wires, striplines, microstrips, etc.) of the controller 400 or of a bridge to which the controller 400 is connected, which can enable the controller 400, processor, memory, one or more sensors, and/or one or more switches to draw electric energy (e.g., electric power, electric current, electric voltage) from one or more connected battery cells.

The monitor and/or control section 452 can comprise one or more integrated monitoring components and/or switches that can facilitate different parameter monitoring and/or collection operations. For example, the monitor and/or control section 452 can comprise one or more sensors that can monitor and/or collect parameter data of the battery cells connected to the controller 400 and/or regarding one or more components of the controller 400 directly. For instance, the monitor and/or control section 452 can comprise one or more sensors (e.g., one or more sensors) for monitoring temperature, pressure (e.g., swelling), chemistry (e.g., chemistry on electrolyte to monitor aging), acceleration (e.g., to sense a crash of, for instance, an electric vehicle comprising device), current (e.g., current flowing into and/or out of device and/or active cell material), voltage (e.g., voltage potential across cell material poles of active cell material), and/or other parameter data of the controller 400 and/or one or more connected battery cells.

To facilitate parameter monitoring and/or different operating modes of the device described above, the monitor and/or control section 452 can comprise a processor and a memory.

Figure 5:
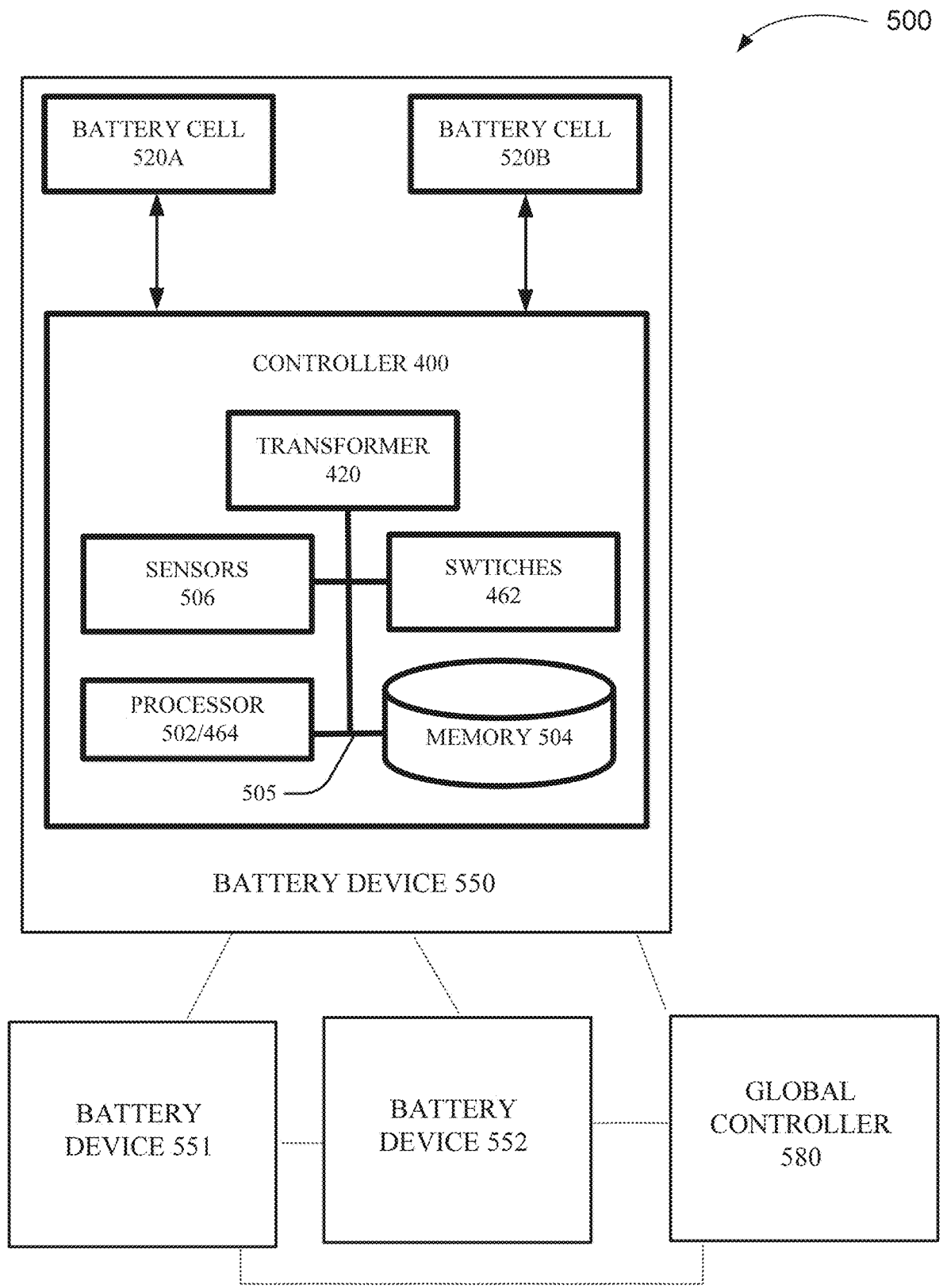
FIG. 5 illustrates a block diagram of the controller of FIG. 4, in accordance with one or more embodiments described herein.

Turning briefly to FIG. 5, an alternative representation of the controller 400 is illustrated as a schematic block diagram 500. As shown, the controller 400 can comprise one or more sensors 506, one or more switches 462, a transformer 420 and/or one or more other transformers, a processor 502 (such as comprised by the processor chip 464) and a memory 504. A bus 505 can provide connection between these components. The controller 400 can be connected to one or more battery cells 520A and 520B

Processor 502 can comprise one or more types of processors and/or electronic circuitry (e.g., a classical processor, a quantum processor, etc.) that can implement one or more computer and/or machine readable, writable, and/or executable components and/or instructions that can be stored on memory. For example, the processor 502 can perform various operations that can be specified by such computer and/or machine readable, writable, and/or executable components and/or instructions including, but not limited to, logic, control, input/output (I/O), arithmetic, and/or the like. The processor 502 can comprise one or more central processing unit (CPU), multi-core processor, microprocessor, dual microprocessors, microcontroller, System on a Chip (SOC), array processor, vector processor, quantum processor, and/or another type of processor. Such examples of the processor can be employed to implement any embodiments described herein.

In an example embodiment, the processor 502 can comprise a central processing unit (CPU) such as, for example, a microprocessor. In some embodiments, processor 502 can comprise and/or employ one or more machine learning (ML) and/or artificial intelligence (AI) models to learn, for instance, one or more operating conditions and/or cause and effect conditions corresponding to the device and/or an external device coupled to the device. In these embodiments, based on learning such one or more operating conditions and/or cause and effect conditions, the processor 502 further can employ the one or more ML and/or AI models to perform one or more tasks including, but not limited to, making a prediction, making an estimation (e.g., cell capacity (e.g., electric energy) of active cell material), classifying data, implementing one or more monitoring and/or control operations of the controller 400, and/or another task.

The memory 504 can store one or more computer and/or machine readable, writable, and/or executable components and/or instructions that, when executed by the processor (e.g., a classical processor, a quantum processor, etc.), can facilitate performance of operations defined by the executable component(s) and/or instruction(s). For example, the memory 504 can store computer and/or machine readable, writable, and/or executable components and/or instructions that, when executed by the processor, can facilitate execution of the various functions described herein relating to the controller 400 as described herein with or without reference to the various figures described herein. For instance, the memory 504 can store computer and/or machine readable, writable, and/or executable components and/or instructions that, when executed by the processor, can facilitate one or more of such parameter monitoring tasks described above and/or to facilitate logging of monitoring data collected by one or more sensors. In another example, memory 504 can store computer and/or machine readable, writable, and/or executable components and/or instructions that, when executed by the processor, can facilitate operation of one or more switches to configure the device to operate in one or more operation modes described herein.

In an embodiment, the memory 504 can store computer and/or machine readable, writable, and/or executable components and/or instructions such as, for instance, a monitoring component that, when executed by the processor 502, can employ one or more sensors of controller 400 to collect parameter data corresponding to the device and/or one or more components thereof. In this embodiment, such a monitoring component can further store and/or log (e.g., via the processor) the parameter data in memory.

In another embodiment, the memory 504 can store computer and/or machine readable, writable, and/or executable components and/or instructions such as, for instance, a machine learning component that, when executed by the processor 502, can facilitate operation of one or more switches (e.g., based on parameter data collected from the device) to configure the device to operate in one or more operation modes described herein. In this embodiment, such a machine learning component can learn to identify certain parameter data collected from the device that can be indicative of certain events and/or conditions associated with the device, a battery pack comprising device, and/or an electronic system (e.g., an electric driveline of an EV) comprising the device. For example, the machine learning component can learn (e.g., by being trained using one or more supervised leaning techniques, unsupervised learning techniques, etc.) to identify certain parameter data that can be indicative of, for instance: a high or low state of charge (SoC) in the device; a crash of a vehicle (e.g., an EV) comprising the device; a high or low temperature of one or more components of the device; a high or low pressure in the device, and/or another event and/or condition. In this example, based on identifying such parameter data that can be indicative of one or more such events and/or conditions defined above, the machine learning component can then configure the device (e.g., via the processor, one or more switches, etc.) in a certain operation mode as described above (e.g., in an off mode and/or a bypass mode based on detecting a crash of a vehicle comprising the device). In some embodiments, such a machine learning component described above can comprise a machine learning model based on artificial intelligence (AI) including, but not limited to, a shallow or deep neural network model, a support vector machine (SVM) model, a classifier, a decision tree classifier, a regression model, and/or any supervised or unsupervised machine learning model that can perform the operations of the machine learning component described above.

The memory 504 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Such examples of the memory 504 can be employed to implement any embodiments described herein.

Still referring to FIG. 5, the controller 400, battery cell 520A and battery cell 520B each are shown as being comprised by a battery device 550. The battery device 550 can be part of a larger battery system, such as including a battery device 551 and a battery device 552. Each of the battery devices 551 and 552 can comprise a respective controller, such as the same as the controller 400, and one or more battery cells. The battery system further can comprise a global controller 580 for controller controllers (e.g., referred to as local controllers) of the battery devices 550, 551 and 552. The global controller 580 and the battery devices 550, 551 and 552 can communicate amongst one another, such as via wireless communication, as represented by dotted lines at FIG. 5.

Referring next to FIG. 7, another depiction is provided of an exemplary battery system 700, in accordance with the aforementioned description regarding battery device, battery cells, battery systems and controller. Repetitive description of like elements employed in one or more other embodiments described herein is omitted for sake of brevity.

The battery system 700 can comprise a vehicle central controller (VCC) and a charge controller (CC). The battery system 700 also can comprise three strings 702, 704 and 706 of battery devices 710. Each battery device 710 can have a different number and can be identified, such as by a respective controller and/or processor by the string number and device number, such as string:device or 3:96. Each of the battery devices 710 within each separate string can be connected to one another, such as via a bridge 712 connected to respective AC poles of the respective controllers of the battery devices 710. Each string 702, 704 and 706 is connected, such as communicatively connected wirelessly to a global controller 780.

In the battery system 700 of FIG. 7, each of the battery devices 710 can be switched into a positive, negative, bypass or no state separately and dynamically by the respective local controllers (e.g., local controllers such as controller 400). The global controller 780 can be configured to at least partially control the local controllers by signaling a voltage output request to the local controllers. The voltage output request and/or any other signals can be sent via broadcast to each of the battery devices, such as simultaneously to each of the battery devices. This voltage output request can include one or more voltage outputs, such as for an auxiliary system and a traction motor, for example. Based on the voltage output request, the local controllers, such as via the respective processors and/or machine learning components, can determine, with inter-controller communication, which battery devices 710 to employ in which states to satisfy the voltage output request.

In one or more embodiments, battery devices 710 can be employed based on a charge level of the respective battery cells, such as employing battery devices 710 having cells with a highest combined charge first.

Figure 10:
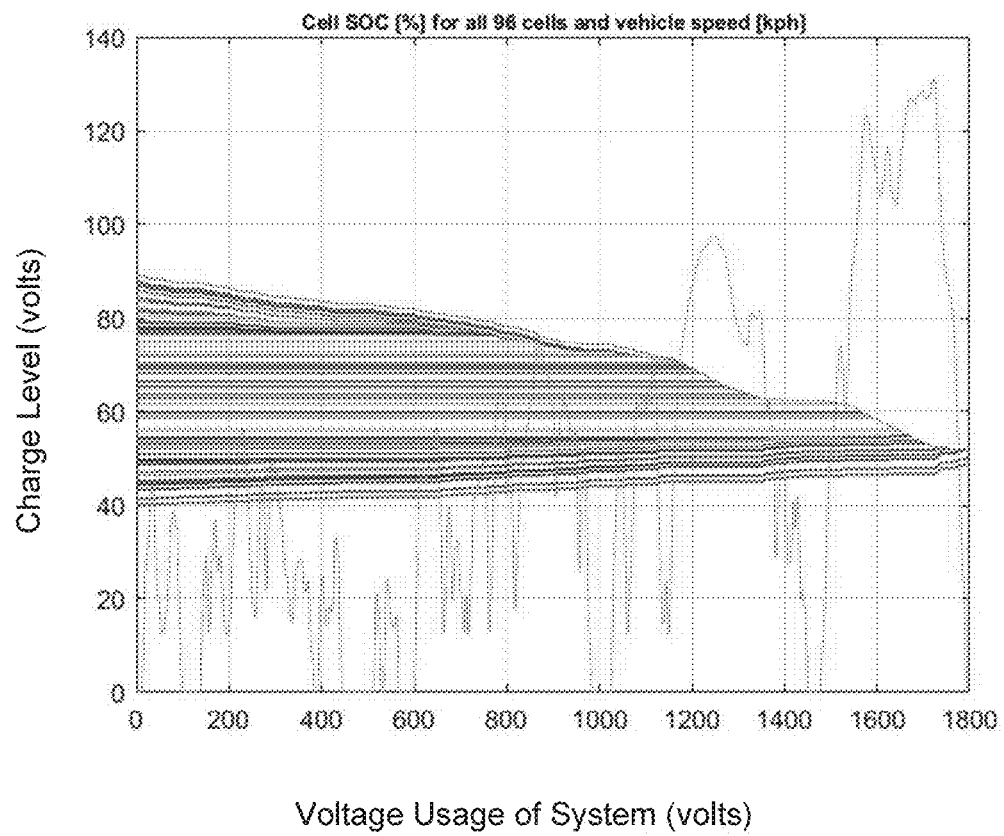
FIG. 10 illustrates a graph of battery cell charge, in accordance with one or more embodiments described herein.

Turning briefly to FIG. 10, in one or more other embodiments, global controller 780 and/or local controllers of battery devices 710 can be employed to provide load balancing or active balancing control of battery devices 710 (e.g., relative to charge level of respective battery cells). For example, in one or more embodiments, high charge battery devices can be employed first and/or low charge battery devices can be charged first. In one or more embodiments, low charge battery devices can be charged via connection to one or more other battery devices. Via the aforementioned balancing, all battery devices of a system can be generally balanced, through use thereof, to have an intermediate charge within a common range, for example. The common range can be selectively controlled, such as by the processor and/or by an entity communicating with the global controller and or local controllers.

As used herein, the terms "entity", "requesting entity" and "user entity" can refer to a machine, device, component, hardware, software, smart device and/or human.

In one example, where many battery devices are connected in series, it can be also possible to connect a respective battery system to e.g., a 50 Hz net and to charge one or more battery cells and/or supply the net with energy from the respective battery cells.

Furthermore, by changing active cells often enough (e.g., changing which battery devices of a battery system are being utilized at any given time), the cells can be protected from damage due to unwanted cell charging.

Figure 8:
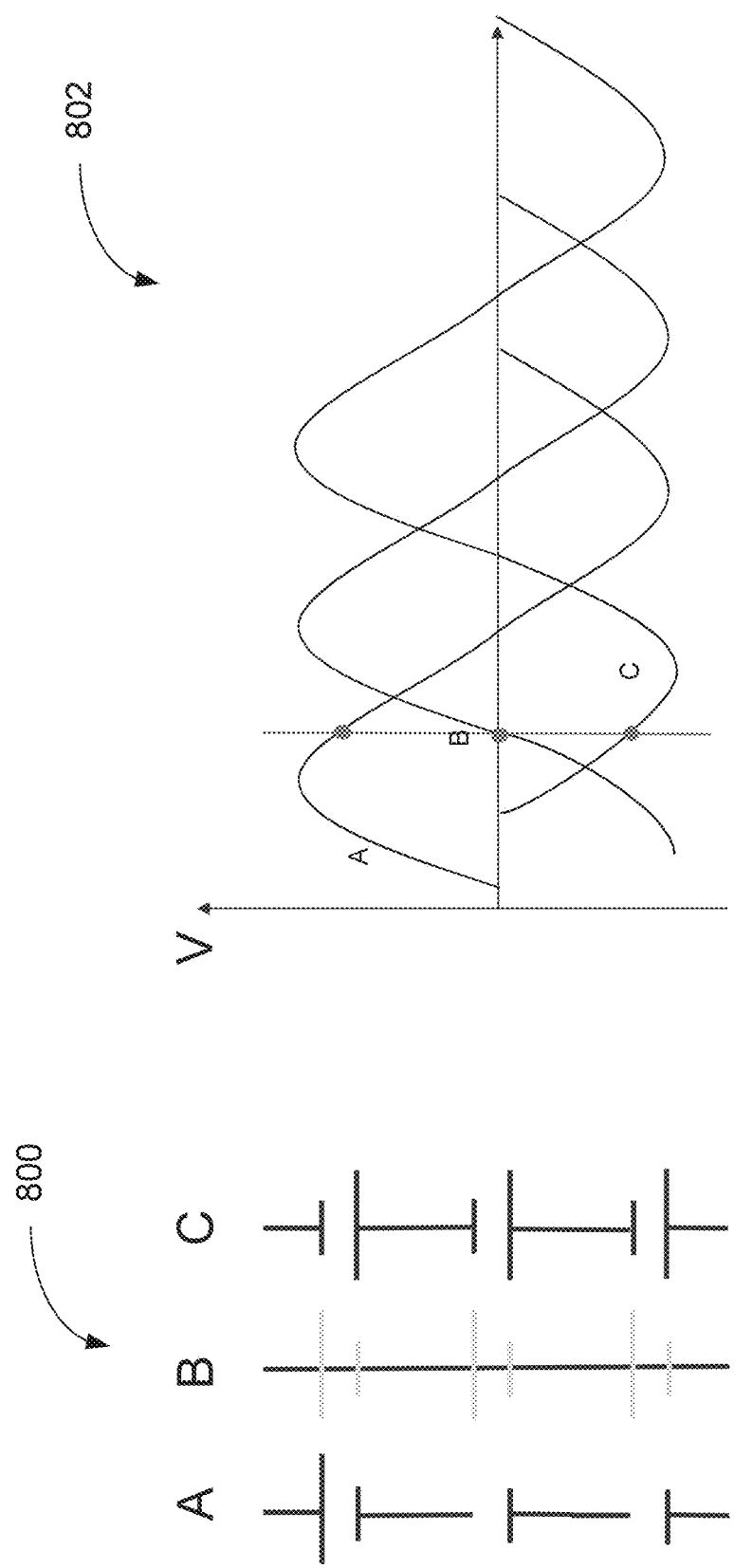
FIG. 8 illustrates a schematic illustration of the battery system of FIG. 7 and a graph of a sinusoidal voltage output provided by the battery system of FIG. 7, in accordance with one or more embodiments described herein.

Turning again to FIG. 7 and also to FIG. 8, if a battery system, such as battery system 700, is connected in three strings (e.g., strings 702, 704, 706), a 3-phase output can be generated from the battery system that can be employed to run an electric machine, such as a motive device, such as a motor or traction motor. For example, as illustrated at graph 802, the battery devices of strings A, B and C can be connected and controller (e.g., via the respective local controller and by a common global controller common to all three strings) to generate three representatively sine-shaped voltages that can be controlled to achieve desired phase currents (torque).

By distributing responsibility for feedback control to the local controllers a high control frequency can be managed. The local nodes can, depending on requested torque from the global controller, be configured, such as via the processor and/or machine learning component, to calculate expected current shape. This calculation can employ modulator angle, physical motor parameters and request info as input. A measured current in a string can be used as feedback to follow expected current shape to build up a 3-phase current control.

Figure 9:
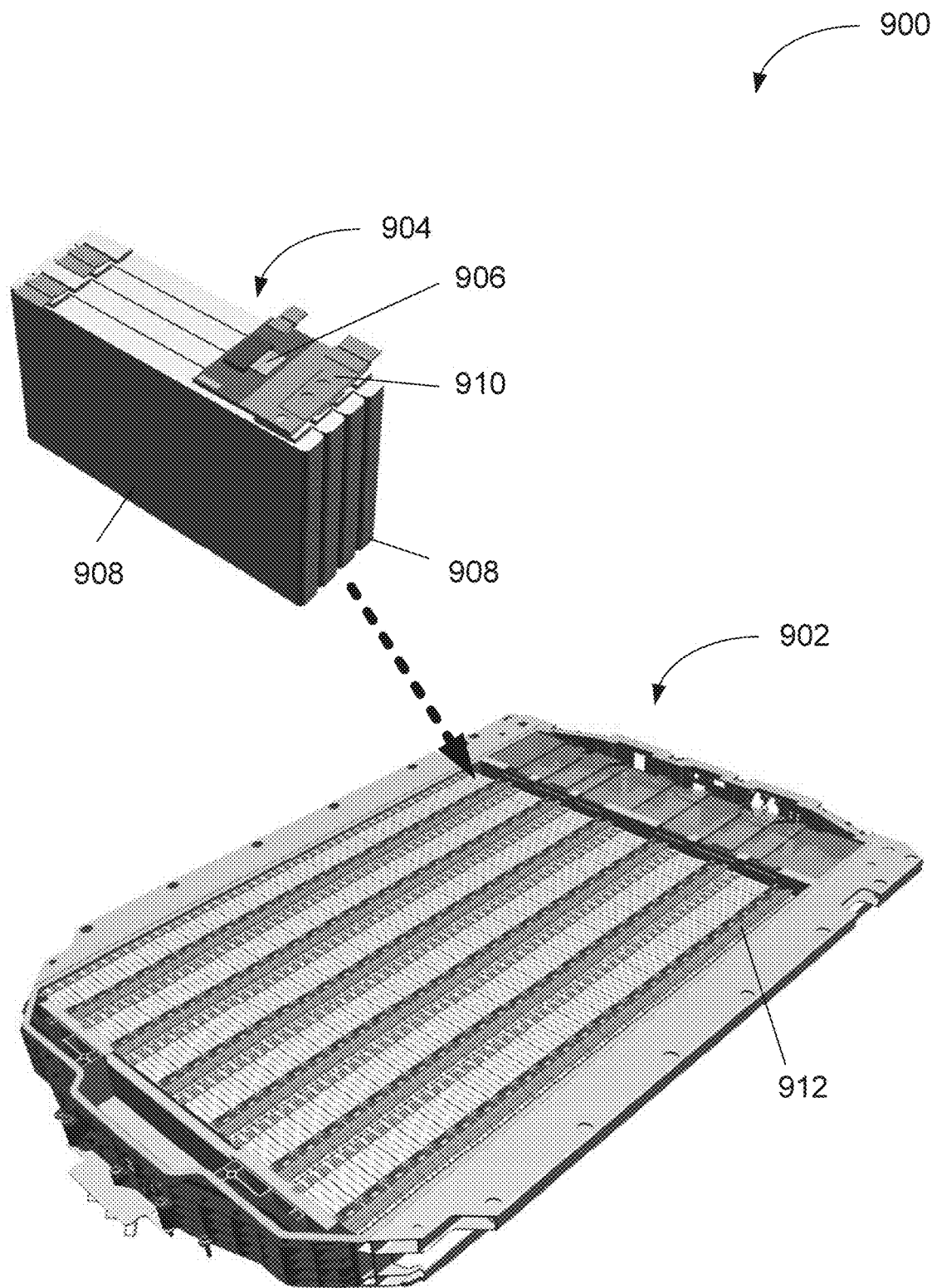
FIG. 9 illustrates an orthogonal view of another battery system, in accordance with one or more embodiments described herein.

Referring next to FIG. 9, another exemplary battery system is illustrated at 900. Repetitive description of like elements employed in one or more other embodiments described herein is omitted for sake of brevity.

Battery system 900 comprises a plurality of battery devices 904 coupled together by bridges 912 in a modular setup 902. Each of the battery devices 904 comprises a controller 906 and respective bridge 910 for connected together a plurality of battery cells 908. As shown at FIG. 9, four battery cells 908 are connected in each battery device 904. The battery devices 904 are connected by the bridges 912 in six strings. Although shown as being positioned in one manner, battery devices 904 can be positioned in a modular setup 902 in other arrangements.

Further, the modular setup 902 allows for one or more battery devices 904, or even entire strings, to be removed and/or replaced without negatively affecting the structure and/or functionality of the battery system and/or any other battery devices in the battery system.

Turning now to FIG. 10, a graph 1000 is illustrated demonstrating state of health (SOH) information use for balancing charge level (SOC). SOC is presented on the y-axis vs. voltage usage on the x-axis. As illustrated, a deviation is depicted between initial SOC of cells. At the end of usage, a majority of cells have a same and/or common range of SOC. That is, overtime, during use discharging and charging of the cells, SOC has been balanced, such as by employing a lower usage of one or more cells due to respective SOH information from monitoring of those one or more cells.

In summary, one or more systems, devices, and/or system-implemented methods are provided that can facilitate provision of varying AC output voltage or DC output voltage, including selectively separately providing a positive voltage output, a negative voltage output and no voltage output. A device can comprise a battery cell, and a controller connected to the battery cell and that varies output from the battery cell, wherein the controller is configured to cause the battery cell to selectively separately provide negative output voltage, positive output voltage and no output voltage. A method can comprise varying output polarity from a multi-cell battery cluster and selectively providing one or both of alternating current (AC) voltage output or direct current (DC) voltage output from the multi-cell battery cluster due to the varying of the output polarity.

Figure 11:
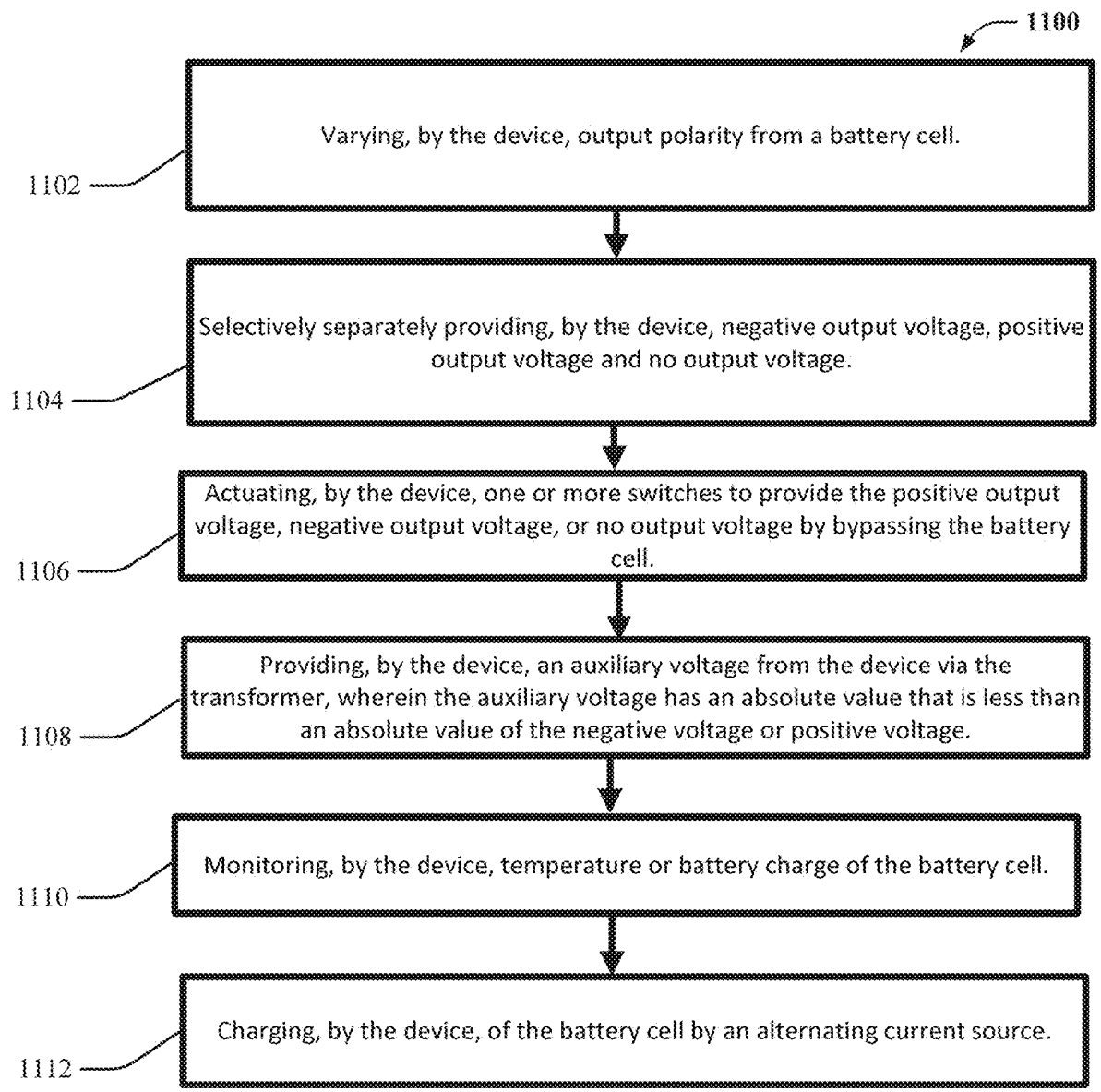
FIG. 11 illustrates a flow diagram of an example, non-limiting device-implemented method that can facilitate provision of varying voltage polarities, including selectively separately providing a positive voltage output, a negative voltage output and no voltage output, in accordance with one or more embodiments described herein.

Turning now to FIG. 11, illustrated is a flow diagram of an example, non-limiting device-implemented method 1100 that can facilitate provision of varying output polarities, including selectively separately providing a positive voltage output, a negative voltage output and no voltage output, in accordance with one or more embodiments described herein. Repetitive description of like elements employed in one or more other embodiments described herein is omitted for sake of brevity.

At 1102, the device-implemented method 1100 can comprise varying, by the device, output polarity from a battery cell.

At 1104, the device-implemented method 1100 can comprise selectively separately providing, by the device, negative output voltage, positive output voltage and no output voltage.

At 1106, the device-implemented method 1100 can comprise actuating, by the device, one or more switches to provide the positive output voltage, negative output voltage, or no output voltage by bypassing the battery cell.

At 1108, the device-implemented method 1100 can comprise providing, by the device, an auxiliary voltage from the device via the transformer, wherein the auxiliary voltage has an absolute value that is less than an absolute value of the negative voltage or positive voltage.

At 1110, the device-implemented method 1100 can comprise monitoring, by the device, temperature or battery charge of the battery cell.

At 1112, the device-implemented method 1100 can comprise charging, by the device, of the battery cell by an alternating current source.

Figure 12:
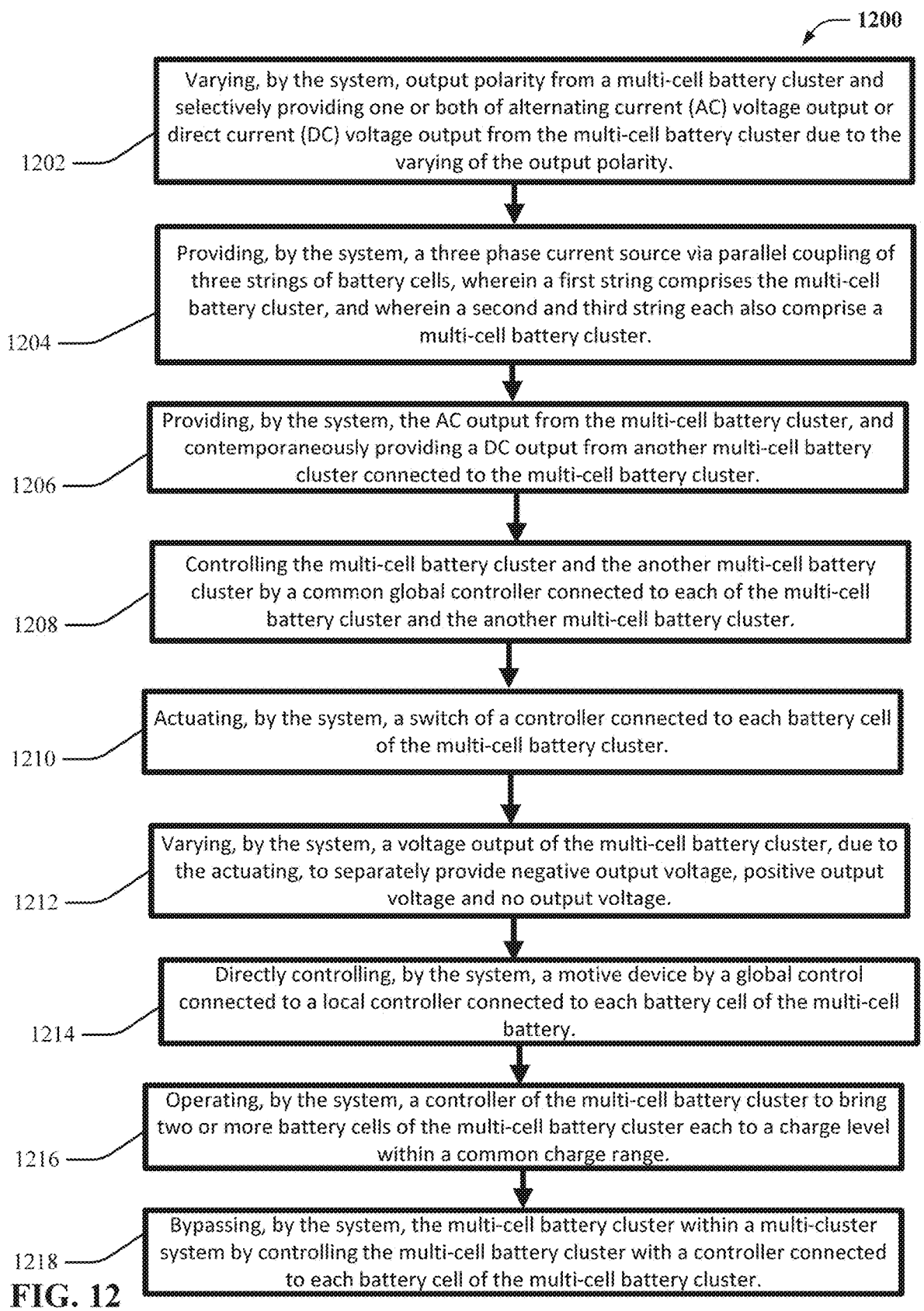
FIG. 12 illustrates a flow diagram of an example, non-limiting system-implemented method that can facilitate provision of varying AC output voltage or DC output voltage, including selectively separately providing a positive voltage output, a negative voltage output and no voltage output, in accordance with one or more embodiments described herein.

Turning now to FIG. 12, illustrated is a flow diagram of an example, non-limiting system-implemented method 1200 that can facilitate provision of varying AC output voltage or DC output voltage, including selectively separately providing a positive voltage output, a negative voltage output and no voltage output, in accordance with one or more embodiments described herein. Repetitive description of like elements employed in one or more other embodiments described herein is omitted for sake of brevity.

At 1202, the system-implemented method 1200 can comprise varying, by the system, output polarity from a multi-cell battery cluster and selectively providing one or both of alternating current (AC) voltage output or direct current (DC) voltage output from the multi-cell battery cluster due to the varying of the output polarity.

At 1204, the system-implemented method 1200 can comprise providing, by the system, a three phase current source via parallel coupling of three strings of battery cells, wherein a first string comprises the multi-cell battery cluster, and wherein a second and third string each also comprise a multi-cell battery cluster.

At 1206, the system-implemented method 1200 can comprise providing, by the system, the AC output from the multi-cell battery cluster, and contemporaneously providing a DC output from another multi-cell battery cluster connected to the multi-cell battery cluster.

At 1208, the system-implemented method 1200 can comprise controlling, by the system, the multi-cell battery cluster and the another multi-cell battery cluster by a common global controller connected to each of the multi-cell battery cluster and the another multi-cell battery cluster.

At 1210, the system-implemented method 1200 can comprise actuating, by the system, a switch of a controller connected to each battery cell of the multi-cell battery cluster.

At 1212, the system-implemented method 1200 can comprise varying, by the system, a voltage output of the multi-cell battery cluster, due to the actuating, to separately provide negative output voltage, positive output voltage and no output voltage.

At 1214, the system-implemented method 1200 can comprise directly controlling, by the system, a motive device by a global control connected to a local controller connected to each battery cell of the multi-cell battery.

At 1216, the system-implemented method 1200 can comprise operating, by the system, a controller of the multi-cell battery cluster to bring two or more battery cells of the multi-cell battery cluster each to a charge level within a common charge range.

At 1218, the system-implemented method 1200 can comprise bypassing, by the system, the multi-cell battery cluster within a multi-cluster system by controlling the multi-cell battery cluster with a controller connected to each battery cell of the multi-cell battery cluster.

The one or more flowcharts and/or block diagrams in the Figures illustrate the architecture, functionality, and operation of one or more possible implementations of one or more systems, apparatuses and/or methods according to various embodiments described herein. In this regard, one or more blocks in the one or more flowcharts and/or block diagrams can represent a module, segment and/or portion of instructions, which can comprise one or more executable instructions for implementing the specified logical function(s). In one or more alternative implementations, one or more functions noted in one or more of the blocks can occur out of the order illustrated in the Figures. For example, one or more blocks shown in succession can be executed substantially concurrently and/or the one or more blocks can be executed in a reverse order as that illustrated, such as depending upon a functionality involved. It also will be noted that one or more blocks of the one or more flowcharts and/or block diagrams, and/or one or more combinations of one or more blocks thereof, can be implemented by a special purpose hardware-based system that can perform one or more of the specified functions and/or can carry out one or more special purpose hardware and/or computer instructions.

As indicated, one or more aspects are described herein with reference to one or more flowchart illustrations and/or block diagrams of one or more methods, apparatuses and/or systems according to one or more embodiments described herein. It will be understood that one or more blocks of the one or more flowcharts and/or block diagrams, and/or one or more combinations of blocks in the one or more flowcharts and/or block diagrams, can be implemented by one or more computer-readable program instructions.

The computer-readable program instructions can be provided to a processor of a general purpose computer, special purpose computer and/or other programmable data processing apparatus to produce a machine. For example, the instructions, which can execute via the processor of the computer and/or other programmable data-processing apparatus, can create one or more means for implementing the one or more functions and/or processes specified in the one or more flowchart and/or block diagram blocks. The computer-readable program instructions can be stored in a computer-readable storage medium that can direct a computer, programmable data processing apparatus and/or other device to function in a particular manner. For example, the computer-readable storage medium having instructions stored therein can comprise an article of manufacture including instructions that can implement one or more aspects of the one or more functions and/or processes specified in the one or more flowchart and/or block diagram blocks. The computer-readable program instructions can be loaded onto a computer, other programmable data processing apparatus and/or other device to cause one or more operational acts to be performed on the computer, other programmable apparatus and/or other device to produce a computer-implemented process. For example, the instructions that can execute on the computer, other programmable apparatus and/or other device can implement the one or more functions and/or processes specified in the one or more flowchart and/or block diagram blocks.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a graphics processing unit (GPU), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. As used herein, terms such as "store," "storage," "data store," data storage," "database," and substantially any other information storage component relevant to operation and functionality of a component are utilized to refer to "memory components," entities embodied in a "memory," or components comprising a memory. A processor can employ distributed and/or federated machine intelligence, which can be employed to operate and/or facilitate one or more of the aforementioned computer-readable program instructions.

Memory and/or memory components described herein can be either volatile memory or nonvolatile memory, and/or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described herein includes one or more mere examples of one or more systems and/or methods. It is, of course, not possible to describe every conceivable combination of components and/or system-implemented methods for purposes of describing the subject matter. Nonetheless, one of ordinary skill in the art can recognize that one or more further combinations and/or permutations of the disclosed subject matter are possible. Furthermore, to the extent that the terms "includes", "has", "possesses" and/or the like are used in the detailed description, claims, appendices and/or drawings, such terms are intended to be inclusive in a manner similar to the term "comprising" as "comprising" is interpreted when employed as a transitional word in a claim.

It will be understood that when an element is referred to as being "coupled" to another element, the term "coupled" can describe one or more different types of coupling including, but not limited to, chemical coupling, communicative coupling, capacitive coupling, electrical coupling, electromagnetic coupling, inductive coupling, operative coupling, optical coupling, physical coupling, thermal coupling and/or another type of coupling. As referenced herein, an "entity" can comprise a machine, device, hardware, software, computing device and/or human. Such entity can facilitate implementation of the subject matter disclosed herein in accordance with one or more embodiments described herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance and/or illustration. For the avoidance of doubt, the subject matter disclosed herein is not limited by such examples. In addition, any aspect and/or design described herein as an "example" and/or "exemplary" is not necessarily to be construed as preferred and/or advantageous over other aspects or designs, nor is it meant to preclude equivalent exemplary structures and/or techniques known to those of ordinary skill in the art.

The description of the one or more various embodiments provided herein has been presented for purposes of illustration but is not intended to be exhaustive and/or limited to the one or more embodiments disclosed. One or more modifications and/or variations will be apparent to those of ordinary skill in the art without departing from the scope and/or spirit of the described embodiments. The terminology used herein was chosen to best explain the principles of the embodiments, practical application and/or technical improvement over technologies found in the marketplace, and/or to enable others of ordinary skill in the art to understand the embodiments disclosed herein.

What is claimed is:

1. A device, comprising:
   a plurality of battery cells; and
   a controller connected to the plurality of battery cells, wherein the controller comprises at least two direct current (DC) output poles, at least two alternating current (AC) output poles, and a plurality of switches configurable to control respective voltage outputs of the plurality of battery cells, and wherein the controller:
   selectively varies output from the plurality of battery cells,
   controls, using the plurality of switches, respective battery cells of the plurality of battery cells to selectively separately provide negative output voltage, positive output voltage, and no output voltage, and
   concurrently provide at least one DC output voltage by the at least two direct current (DC) output poles, and at least one AC output voltage by the at least two alternating current (AC) output poles based on the controlling.

2. The device of claim 1, wherein the plurality of switches are part of one or more bridge circuits.

3. The device of claim 1, wherein the controller comprises a transformer and further is configured to provide an auxiliary voltage via the transformer, wherein the auxiliary voltage has an absolute value that is less than an absolute value of the negative output voltage or positive output voltage.

4. The device of claim 1, wherein the controller comprises a processor that monitors at least one of respective temperatures or respective battery charge of the plurality of battery cells.

5. The device of claim 1, wherein the controller comprises a transformer that enables charging of the plurality of battery cells by an alternating current source.

6. The device of claim 1, further comprising:
   wherein the controller further is configured to operate the plurality of switches of the controller to selectively separately provide the negative output voltage, positive output voltage and no output voltage from any one or more of the plurality of battery cells at a given point in time to provide the at least one DC output voltage and the at least one AC output voltage.

7. A method, comprising:
   selectively varying, by controller of a battery device, output polarity from a multi-cell battery cluster, wherein the controller is connected to the multi-cell battery cluster and comprises at least two direct current (DC) output poles, at least two alternating current (AC) output poles, and a plurality of switches configurable to control respective voltage outputs of battery cells of the multi-cell battery cluster;
   controlling, by the controller, using the plurality of switches, respective battery cells of the multi-cell battery cluster to selectively separately provide negative output voltage, positive output voltage, and no output voltage; and
   concurrently providing at least one DC voltage output by the at least two direct current (DC) output poles, and at least one AC voltage output by the at least two alternating current (AC) output poles based on the controlling.

8. The method of claim 7, further comprising:
providing a three phase current source via parallel coupling of three strings of battery cells, wherein a first string comprises the multi-cell battery cluster, and wherein a second string and a third string each comprise respective other multi-cell battery clusters.

9. The method of claim 7, wherein the at least two DC output poles are isolated from each other.

10. The method of claim 7, wherein the plurality of switches are part of one or more bridge circuits.

11. The method of claim 7, further comprising:
directly controlling a motive device by the controller.

12. The method of claim 7, further comprising:
managing, by the controller, a charging operation to bring two or more battery cells of the multi-cell battery cluster each to a charge level within a common charge range.

13. The method of claim 7, further comprising:
selectively bypassing, by the controller, one or more battery cells of the multi-cell battery cluster to control the one or more battery cells to provide the no output voltage.

14. A vehicle, comprising:
a plurality of battery cells; and
a controller connected to the plurality of battery cells, wherein the controller comprises at least two direct current (DC) output poles, at least two alternating current (AC) output poles, and a plurality of switches configurable to control respective voltage outputs of the plurality of battery cells, and wherein the controller:
varies output from the plurality of battery cells,
controls, using the plurality of switches, respective battery cells of the plurality of battery cells to selectively separately provide negative output voltage, positive output voltage, and no output voltage, and
concurrently provide at least one DC voltage output by the at least two direct current (DC) output poles, and at least one AC output voltage by the at least two alternating current (AC) output poles based on the controlling.

15. The vehicle of claim 14, wherein the plurality of switches are part of one or more bridge circuits.

16. The vehicle of claim 14, wherein the controller comprises a transformer and further is configured to provide an auxiliary voltage via the transformer, wherein the auxiliary voltage has an absolute value that is less than an absolute value of the negative output voltage or positive output voltage.

17. The vehicle of claim 14, wherein the controller comprises a transformer that enables charging of the plurality of battery cells by an alternating current source.

18. The vehicle of claim 14, wherein the controller is configured to signal a voltage output request to the plurality of battery cells.

19. The vehicle of claim 18, wherein the plurality of battery cells are configured to receive the voltage output request and to communicate with one another to cause the plurality of battery cells to provide the respective voltage outputs based on the voltage output request.

20. The vehicle of claim 18, wherein the vehicle further comprises:
a motive device connected to the controller, wherein the motive device moves the vehicle by direct control from the controller.

* * * * *